United States Patent [19]
Matsumoto

[11] Patent Number: 5,290,664
[45] Date of Patent: Mar. 1, 1994

[54] METHOD FOR PREPARING ELECTRODE FOR SEMICONDUCTOR DEVICE

[75] Inventor: Nobuyuki Matsumoto, Yamatokoriyama, Japan

[73] Assignee: Sharp Kabushiki Kaisha, Osaka, Japan

[21] Appl. No.: 997,646

[22] Filed: Dec. 28, 1992

Related U.S. Application Data

[63] Continuation of Ser. No. 675,619, Mar. 27, 1991, abandoned.

Foreign Application Priority Data

Mar. 29, 1990 [JP] Japan .................. 2-84552

[51] Int. Cl.⁵ .................................................. G03C 5/00
[52] U.S. Cl. .................................... 430/296; 430/311; 430/313; 430/314; 430/329; 430/942; 250/492.3
[58] Field of Search ............ 430/296, 311, 312, 313, 430/314, 319, 329, 942; 250/492.1, 492.2, 492.3

[56] References Cited

U.S. PATENT DOCUMENTS

| | | | |
|---|---|---|---|
| 4,283,483 | 8/1981 | Coane | 430/296 |
| 4,315,984 | 2/1982 | Okazaki | 430/296 |
| 4,699,870 | 10/1987 | Iwadate | 430/296 |

*Primary Examiner*—Marion E. McCamish
*Assistant Examiner*—Kathleen Duda
*Attorney, Agent, or Firm*—Nixon & Vanderhye

[57] ABSTRACT

A preparation method of a gate electrode for semiconductor device which comprises forming a plurality of specific resist layers sensitive to an electron beam over a substrate through a silicon nitride film, subjecting the resist layers to an electron beam lithography to obtain an opening having a specific configuration at the opening portion, etching the silicon nitride film through the opening to form an opening in the silicon nitride film, etching the substrate through the opening of the silicon nitride film to form a cavity in the substrate, and forming a metal member on the substrate in the cavity in accordance with a metal-deposition and lift-off process to obtain the gate electrode in a projected shape.

15 Claims, 2 Drawing Sheets

FIG. 4 *(PRIOR ART)*

METHOD FOR PREPARING ELECTRODE FOR SEMICONDUCTOR DEVICE

This is a continuation of application Ser. No. 07/675,619, filed Mar. 27, 1991, now abandoned.

BACKGROUND OF THE INVENTION

1. Field of the Invention

The invention relates to a preparation method for an electrode and more particularly to a method suitable for the preparation of gate electrodes in various semiconductor devices.

2. Description of the Related Art

GaAs-MESFET or AlGaAs/GaAs-HEMT devices, which have conventionally been applied as a low noise amplifier for satellite broadcasting and communications in microwave band, are required to have lower parasitic capacitance by reducing gate lengths in order to improve their low noise amplification property.

Quartermicron gate electrodes are typically fabricated by lift-off process in the following manner to which FIG. 4 is referred. First, a silicon nitride film 12 and a resist film 13 are formed in this order on a GaAs substrate 11. A gate pattern is formed on the resist film 13 by electron beam lithography and used as a mask to open a hole in the silicon nitride film 12 which is then used as a mask to form a cavity 14 in the GaAs substrate 11. Thereafter, a metal deposition is conducted from the side of the silicon nitride film 12 and then the resist film 13 is removed by use of an organic solvent, leaving the deposited metal in the cavity on a corresponding portion of the substrate to the gate pattern to form a gate electrode 15. Reference numeral 16 designates the metal layer before the removal.

In the conventional preparation method for gate electrodes by the lift-off process using the resist film, the more the gate pattern is to be subminiaturized, the more the deposited metal 16 quickly closes up the hole of the resist film as already shown in FIG. 4, so that the resultant gate electrode is relatively smaller in height with respect to the gate length (a width of the contacting portion of the gate electrode with the substrate), resulting in the problem that devices with the resultant gate electrode are poor in their properties due to increased gate resistance based on the reduced gate length.

The invention has been designed to overcome the above problem. An object of the invention is to provide a preparation method for gate electrode which allows the height of the gate electrode formed to be enlarged with respect to gate length and, in other words, enables the gate electrode to be prepared with reduced gate length without causing increase of gate resistance.

The inventor has made earnest study to reduce the gate length without causing increase of gate resistance and found that the reason of the gate electrode not being prepared with larger height is due to that the opening of the resist layer has such a cross-sectional shape as extending almost vertically or being reversely tapered toward the outer area from which a metal vapour is supplied under the metal deposition, so that the deposited metal is caused to quickly close up the hole of thee resist layer immediately after start of the deposition. The inventor also found that when the hole of the resist layer has such a cross-sectional shape as being normally tapered toward the outer area, it takes longer time for the deposited metal to close up the hole of the resist layer to thereby allow quartermicron gate electrode to be deposited with larger height.

However, in the case of fabrication by using a conventional resist film of single layer type, electron beam lithography is hard to provide the hole of the resist film with the cross-sectional shape as being normally tapered as aforesaid.

SUMMARY OF THE INVENTION

According to the present invention, there is provided a method for preparing an electrode for semiconductor device comprising the steps of:

(a) forming two resist layers sensitive to an electron beam over a substrate through a silicon nitride film formed on the substrate, said two resist layers being composed of a low sensitive resist layer and a high sensitive resist layer placed on the low sensitive resist layer, (b) irradiating said two resist layers in a predetermined pattern with the electron beam and developing the irradiated resist layers to form a resist pattern having an opening configuration being larger at the high sensitive resist layer in opening size than that at the low sensitive resist layer, (c) etching said silicon nitride film through the resist pattern to form in the film an opening corresponding in size to that of the low sensitive resist layer, (d) etching said substrate through the opening in the silicon nitride film to form in the substrate a cavity having a capacity for preparing the electrode, (e) depositing a metal over the region including said opening configuration of the resist pattern to form a metal member in projected shape on the substrate in said cavity while a metal layer being formed on the resist layers, and (f) removing the resist layers of the resist pattern to lift off the metal layer on the resist layers to leave the metal member in projected shape as the electrode.

The electrode according to the present invention can be given larger height with respect to a size of the contacting portion with the substrate (gate length) and also can be prepared as reduced in gate length without causing increase of gate resistance. The present invention realizes a quartermicron gate electrode of a particularly high aspect ratio which is useful for a high frequency FET device to reduce gate resistance thereof.

BRIEF DESCRIPTION OF THE DRAWINGS

FIG. 4 is a schematic diagram showing preparing the steps of a conventional gate electrode.

DETAILED DESCRIPTION OF THE PREFERRED EMBODIMENTS

Figure 1:
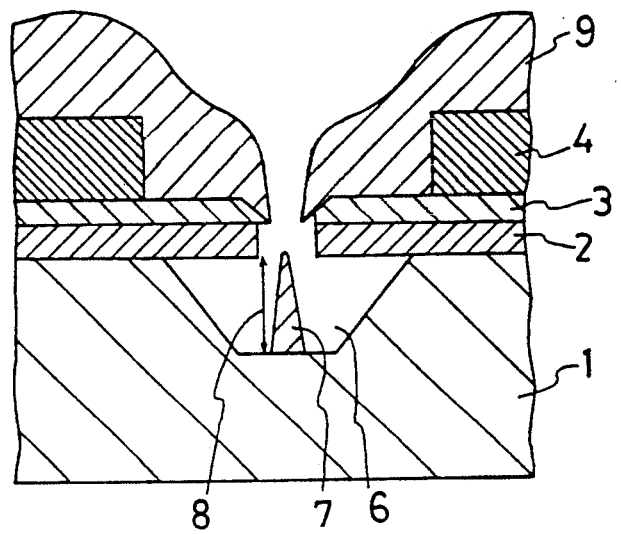
FIGS. 1 and 2 are schematic diagrams showing the steps of an example of the present invention.

In the present invention, two kinds of resist layers being low and high sensitive to an electron beam are formed in this order over a substrate of which surface covered with a silicon nitride film. The substrate should be semiconductive for forming a gate electrode and may be a GaAs substrate, a AlGaAs/GaAs substrate, an InP substrate and the like. The silicon nitride film is provided for supporting the low sensitive resist layer and may be formed on the substrate, for example, by CVD process and the like. The thickness of the silicon nitride layer is preferably 300 to 600. The low sensitive resist layer is used for providing an opening smaller in size than that of the high sensitive resist layer, and may be formed by applying on the silicon nitride film, for example, methacrylic acid/phenyl methacrylate copolymer containing 10 to 40 mol % of methacrylic acid. The thickness of the low sensitive resist layer is preferably 0.05 to 0.20 μm. The highly sensitive resist layer is used for forming, above the opening of the low sensitive resist layer, an opening larger in size than that of the low sensitive resist layer and may be formed by applying on the low sensitive resist layer, for example, polydimethylglutamide or methacrylic acid/phenyl methacrylate copolymer containing 4 to 8 mol % of methacrylic acid. The thickness of the high sensitive resist layer is preferably 0.2 to 0.4 μm.

In the present invention, an electron beam is applied in a predetermined pattern to the resist layers from the upper side (high sensitive side) thereof, and then the high and low sensitive resist layers are developed to form a resist pattern having an opening configuration in which the high sensitive resist layer has an opening larger in size than that of the low sensitive resist layer. The electron beam is used for exposing the low and high sensitive resist layers in a predetermined pattern. The irradiation is conducted by applying the electron beam to the low and high sensitive resist layers from the upper side thereof through a mask in a predetermined pattern, under the conditions of the electron beam being 20 to 30 KV of acceleration voltage, 0.5 to 1.5 nA of applied current, 300 to 600 Å of beam diameter and 1.0 to 5.0 nC/cm of radiation.

The development is conducted to first make an opening in the high sensitive resist layer of the above resist layers exposed in a predetermined pattern and then make in the low sensitive resist layer an opening smaller in size than and in continuation to that of the high sensitive resist layer. The development may be conducted by a single etchant but preferably conducted first by a low solvent power developer to make an opening in the high sensitive resist layer and then by a high solvent power developer to treat that opening, while making an opening in the low sensitive resist layer. The size of the opening of the high sensitive resist layer is larger than that of the low sensitive resist layer and preferably 0.8 to 1.5 μm in diameter, and the size of the opening of the low sensitive resist layer is preferably 0.05 to 0.3 μm in diameter.

When the opening size of the high sensitive resist layer is not larger than that of the low sensitive resist layer or out of the above preferable range, or in the case that the opening size of the low sensitive resist layer is smaller than the above preferable range, the opening of the low sensitive resist layer is easily closed up by a metal deposited thereon in the metal deposition step described later, so that the metal is insufficiently deposited on the substrate in the cavity to provide no electrode or any electrodes having no sufficient height or thickness. Also, in the case that the opening size of the low sensitive resist layer is larger than the aforesaid preferable range, the opening of the silicon nitride film under and in continuation to that of the low sensitive resist layer become larger in size, leading to a problem that the gate length cannot be reduced.

In the present invention, an opening of the silicon nitride film is formed corresponding in size to that of the low sensitive resist layer. The opening of the silicon nitride film is used for forming a cavity in a predetermined size in the substrate in which cavity a metal is deposited to form an electrode. The opening of the silicon nitride film may be formed, for example, by a plasma dry etching using the low sensitive resist layer as a mask. The etching may be conducted by treating the silicon nitride film through the opening of the low sensitive resist layer with a plasma generated from a mixed gas, for example, of $CF_4$ and $O_2$. The size of the opening of the silicon nitride film is preferably 0.1 to 0.4 μm.

Then the substrate is etched in a predetermined depth through the opening of the silicon nitride film by the use of a suitable etchant to form the cavity for the electrode formation in the substrate. The etchant may be selectively used depending on the kinds of the substrates. For example, an aqueous mixture of hydrochloric acid and hydrogen peroxide may be used for a GaAs substrate. The cavity usually has such a cross-sectional shape as being tapered to its bottom surface as shown in the figures, and which shape is preferably 0.2 to 0.5 μm in width and 0.2 to 0.4 μm in depth. The depth of the cavity is almost equivalent to the height of the gate electrode to be fabricated, so that the more the substrate is etched deeply, the more the gate resistance can be reduced.

Noted that the depth of the cavity of the substrate used for HEMT, MESFET or like semiconductor device usually corresponds to the thickness of the layer heavily doped with an impurity in the semiconductor device, so that the more the substrate is etched deeply to have a cavity of larger depth, the more the gate resistance as well as the source resistance can be reduced, resulting in the semiconductor of higher performance. However, when the above layer heavily doped with an impurity in the substrate is too thick, the substrate is difficult to be etched with good reproductivity even in a wafer state which results in undesirable variation of the device characteristics in mass production. Accordingly, the depth of the cavity in the substrate is preferably adjusted to 0.2 to 0.3 μm.

A metal is then deposited over the region including the aforesaid opening configuration of the resist pattern to form a metal layer on the high sensitive resist layer and the low sensitive resist layer and also form a metal member (gate electrode) typically in a triangular shape in cross-section on the substrate surface in the cavity. Specific examples of the metal is aluminum, an aluminum alloy, a combination of Ti/Pt/Au and the like. The deposition may be conducted by sputtering, electron beam evaporation, resistance heating evaporation and the like.

The high sensitive and low sensitive resist layers and the metal layer formed thereon are then removed to leave the metal member, as the electrode, on the substrate surface in the cavity. Removal of the resist layers is conducted by the use of an organic solvent, for example, acetone, chlorobenzene and the like which are able to dissolve the high and low sensitive resist layers. The metal layer is lifted off with the removal of the resist layers. The resultant metal member (electrode) has suitably a shape of 0.05 to 0.3 μm in width (gate length) and 0.2 to 0.3 μm in height.

The resultant electrode may suitably be used as a gate electrode to fabricate a transistor or like semiconductor device.

In the method detailed above, the high sensitive resist layer and the low sensitive resist layer are used in combination. Alternatively, three resist layers being of a high sensitive, medium sensitive and low sensitive resist layers may be used to form the same electrode.

That is, according to another aspect of the present invention, there is provided a method for preparing an electrode for semiconductor device, comprising the steps of:

(a') forming three resist layers sensitive to an electron beam over a substrate through a silicon nitride film formed on the substrate, said three resist layers being composed of a low sensitive resist layer, a high sensitive resist layer and a medially sensitive resist layer laminated upwardly in this order over the the substrate, (b') irradiating said three resist layers in a predetermined pattern with the electron beam and developing the irradiated resist layers to form a resist pattern having an opening configuration being larger at the high sensitive resist layer in opening size than those at the low and medially sensitive resist layers and being larger at the medially sensitive resist layer than that at the low sensitive resist layer, (c) etching said silicon nitride film through the resist pattern to form in the film an opening corresponding in size to that of the low sensitive resist layer, (d) etching said substrate through the opening in the silicon nitride film to form in the substrate a cavity having a capacity for preparing the electrode, (e) depositing a metal over the region including said opening configuration of the resist pattern to form a metal member in projected shape on the substrate in said cavity while a metal layer being formed on the resist layers, and (f) removing the resist layers of the resist pattern to lift off the metal layer on the resist layers to leave the metal member in projected shape as the electrode.

In this second invention, a resist layer low sensitive to electron beam, a resist layer high sensitive to electron beam and a resist layer having a medially sensitive to the electron beam, are formed upwardly in this order over the substrate on whose surface a silicon nitride film is formed, thereby preparing the three resist layers. The above low sensitive and high sensitive resist layers may be formed similarly with the manner referred to in the foregoing method.

The resist layer medially sensitive to the electron beam is provided for forming the upper resist layer and may be made, for example, of methacrylic acid/phenyl methacrylate copolymer having 10 to 40 mol % of methacrylic acid content.

The medially sensitive resist layer as well as the low and high sensitive resist layers are each preferably a methacrylic acid/phenyl methacrylate copolymer, the copolymerization ratios of methacrylic acid to phenyl methacrylate in the low sensitive resist layer, the medially sensitive resist layer and the high sensitive resist layer are preferably to be decreased with this laminated order. The thickness of the lower resist layer (the low sensitive resist layer) is preferably 0.05 to 0.20 μm, the interposed resist layer (the high sensitive resist layer) 0.1 to 0.3 μm and the upper resist layer (the medially sensitive resist layer) 0.05 to 0.1 μm.

In the second invention, the electron beam is applied in a predetermined pattern over the resist layers from the upper side thereof, and then, the upper, interposed and lower resist layers are developed to form a resist pattern having an opening configuration that the interposed resist layer has an opening larger in size than the lower and upper resist layers with the opening of the upper resist layer being larger than that of the lower resist layer.

The development may be conducted by a single etchant. However, in the case of using a substrate on which the electron beam is not efficiently reflected, the development by the single etchant results in the opening at the upper resist layer having a similar vertical cross-sectional shape to that of the lower resist layer. Hence, the upper and interposed resist layers are preferably first developed by a low solvent power developer and thereafter, the resultant opening of the upper and middle resist layers are treated by a high solvent power developer, while developing the lower resist layer to open an opening therein, thereby allowing the upper resist layer to have a larger opening than that of the lower resist layer.

Then, an electrode is fabricated on the substrate surface in the cavity in the similar manner with that referred to in the first invention.

In either the first or second invention, the resist layers having the low and high sensitive resist layers are used to provide an opening configuration larger in size at the upper part and smaller in size at the lower part, so that the opening in the resist pattern is not readily closed up by the metal under the deposition while forming a projected metal member in a shape of smaller width and a larger height on the substrate in the cavity.

EXAMPLES

Example 1

The electrode in a projected shape as shown in FIG. 1 was fabricated in the following manner. In FIG. 1, indicated at 1 denotes a GaAs substrate, at 2 a silicon nitride film, at 3 a lower resist layer (low sensitive to electron beam), at 4 an upper resist layer (high sensitive to electron beam), at 6 a cavity for forming an electrode, at 7 a gate electrode (metal member) prepared, at 8 the height of the gate electrode, and at 9 a metal layer.

The preparation of the gate electrode was conducted by the following steps.

First, a GaAs substrate 1 (wafer) having thereon a silicon nitride film 2 of 0.1 μm in thickness formed by plasma CVD process is placed on a spin coater. On the surface of the nitride film 2 was applied dropwise a solution of a low sensitive resist material (methylcellosolve acetate solution of 3.5 wt % of methacrylic acid/phenyl methacrylate copolymer containing 25.4 mol % of methacrylic acid and 74.6 mol % of phenyl methacrylate) to conduct spin coating at 2000 rpm followed by prebaking at 230° C. for 30 min. The thickness of the resultant low sensitive resist layer after baking was 0.10 μm. Then, on the low sensitive resist layer was applied dropwise a solution for a high sensitive resist material (cyclopentane solution of 5 wt % of polydimethyl glutalimide (Tradename SAL110, Shiply Inc.) to conduct spin coating at 3000 rpm followed by prebaking at 200° C. for 30 min. The thickness of the resultant high sensitive resist layer after baking was 0.35 μm. The total thickness of the resultant two resist layers was 0.45 μm and any material mixing between the resist layers were not found.

An electron beam was applied in a predetermined pattern on the two resist layers over the substrate under the conditions of 25 KV of acceleration voltage, $1 \times 10^{-9}$ A of applied current, 500 Å in beam diameter and 5.0 nC/cm of radiation.

Then, the upper resist layer (high sensitive to electron beam) was first developed by the use of the developer for SAL110 (aqueous alkaline solution), and thereafter the lower resist layer (low sensitive to electron beam) was developed by a mixture of 70% of methyl isobutyl ketone and 30% of ethylcyclohexane. The size of the opening (hole) made at the lower resist layer 3 was 0.2 $\mu$m and that at the upper resist layer 4 was 0.8 $\mu$m.

Next, the silicon nitride film 2 was subjected to plasma dry etching using a mixed gas of 80% of $CF_4$ and 20% of $O_2$ through the lower resist layer's opening, to form an opening (hole) in the film in order to partially expose the GaAs substrate, followed by etching the exposed GaAs substrate to 0.3 $\mu$m in depth by the use of an aqueous solution of hydrochloric acid and hydrogen peroxide to form the cavity 6. Aluminum was then deposited over the resist pattern and toward the etched substrate by means of electron beam evaporation system to provide an aluminum layer or member of 0.3 $\mu$m in thickness or height, and then the resist layers and the aluminum layer deposited thereon were removed by the lift-off process to leave the projected aluminum member in the cavity to obtain the gate electrode 7. The gate length and the height of the resultant gate electrode was measured by the use of scanning electron microscopy.

As a result, the gate electrode obtained was revealed to have a gate length of 0.2 $\mu$m and a gate height of 0.3 $\mu$m.

Example 2

Figure 2:
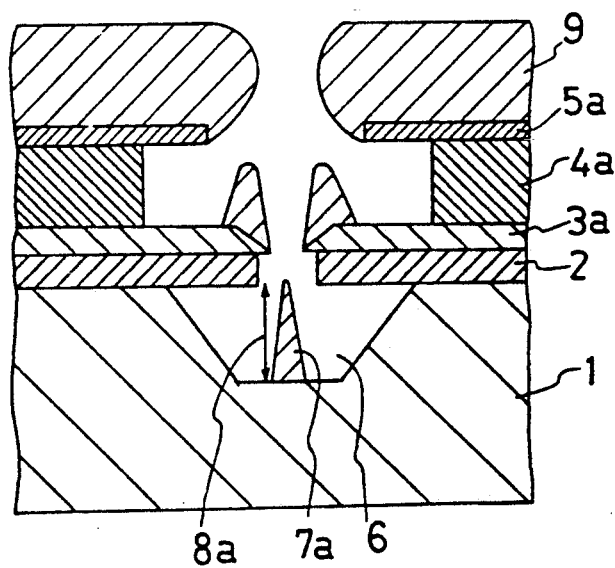

The electrode as shown in FIG. 2 was fabricated in the following manner. In FIG. 2, indicated at 1 designates a GaAs substrate, at 2 a silicon nitride film, at 3a a lower resist layer (low sensitive to electron beam), at 4a an intermediate resist layer (high sensitive to electron beam), at 5a an upper resist layer (medially sensitive to electron beam), at 6 a cavity for forming an electrode, at 7a a gate electrode, at 8a the height of the gate electrode, and at 9 a metal layer.

A GaAs substrate (wafer) having thereon a silicon nitride film of 0.1 $\mu$m in thickness formed by plasma CVD process was placed on a spin coater. On the nitride film was applied dropwise a solution of a low sensitive resist material (methylcellosolve acetate solution of 3.5 wt % of methacrylic acid/phenyl methacrylate copolymer containing 25.4 mol % of methacrylic acid and 74.6 mol % of phenyl methacrylate) to conduct spin coating at 2000 rpm followed by prebaking at 230° C. for 30 min. The thickness of the resultant low sensitive resist layer 3a after baking was 0.10 $\mu$m.

Then, on the low sensitive resist layer 3a was applied dropwise a solution of a high sensitive resist material (iso-amyl ketone solution of 8 wt % of methacrylic acid/phenyl methacrylate copolymer containing 5.7 mol % of methacrylic acid and 94.3 mol % of phenyl methacrylate) to conduct spin coating at 4000 rpm followed by prebaking at 230° C. for 30 min. The thickness of the resultant high sensitive resist layer 4a (the intermediate layer) after baking was 0.25 $\mu$m.

On the high sensitive resist layer 4a was applied dropwise a solution of a medially sensitive resist material (ethylcellosolve solution of 3 wt % of methacrylic acid/phenyl methacrylate copolymer containing 20.0 mol % of methacrylic acid and 80.0 mol % of phenyl methacrylate) to conduct spin coating at 3000 rpm followed by prebaking at 230° C. for 30 min. The thickness of the resultant medially sensitive resist layer 5a after baking was 0.08 $\mu$m. The total thickness of the resultant three resist layers was 0.43 $\mu$m and any material mixing between the resist layers were not found.

An electron beam was then applied in a predetermined pattern on the three resist layers over the substrate under the conditions of 25 KV of acceleration voltage, $1 \times 10^{-9}$ A of applied current, 500 Å in beam diameter and 2.5 nC/cm of radiation.

Then, the three resist layers were developed at 23° C. for 120 seconds by the use of a mixed solvent (low dissolubility) of 20% of dimethyl acetamide and 80% of butylcellosolve to open a hole extending through the upper and intermediate resist layers 5a, 4a with the lower resist layer 3a having a small exposed surface corresponding in size to a hole to be opened in the lower resist layer. Thereafter, the resist layers are again developed at 23° C. for 120 seconds by the use of a mixed solvent (high dissolubility) of 80% of methyl isobutyl ketone and 20% of ethylcyclohexane, followed by treating at 23° C. for 30 seconds with ethylcyclohexane to form a desired resist pattern over the substrate.

Next, the silicon nitride film 2 was subjected to plasma dry etching using a mixed gas of 80% of $CF_4$ and 20% of $O_2$ through the lower resist layer's opening, to form an opening (hole) in the film in order to partially expose the GaAs substrate, followed by etching the exposed GaAs substrate to 0.3 $\mu$m in depth by the use of an aqueous solution of hydrochloric acid and hydrogen peroxide to form the cavity 6. Aluminum was then deposited over the resist pattern and toward the etched substrate by means of electron beam evaporation system to provide an aluminum layer or member of 0.3 $\mu$m in thickness or height, and then the resist layers and the aluminum layer deposited thereon were removed by the lift-off process to leave the projected aluminum member in the cavity to obtain the gate electrode 7a.

Example 3

An electrode was fabricated in a similar manner to that of Example 2 except that a solution of a low sensitive resist material was applied at an amount enough to provide the low sensitive resist layer (lower resist layer) with thickness of 0.20 $\mu$m in place of 0.10 $\mu$m.

Figure 3:
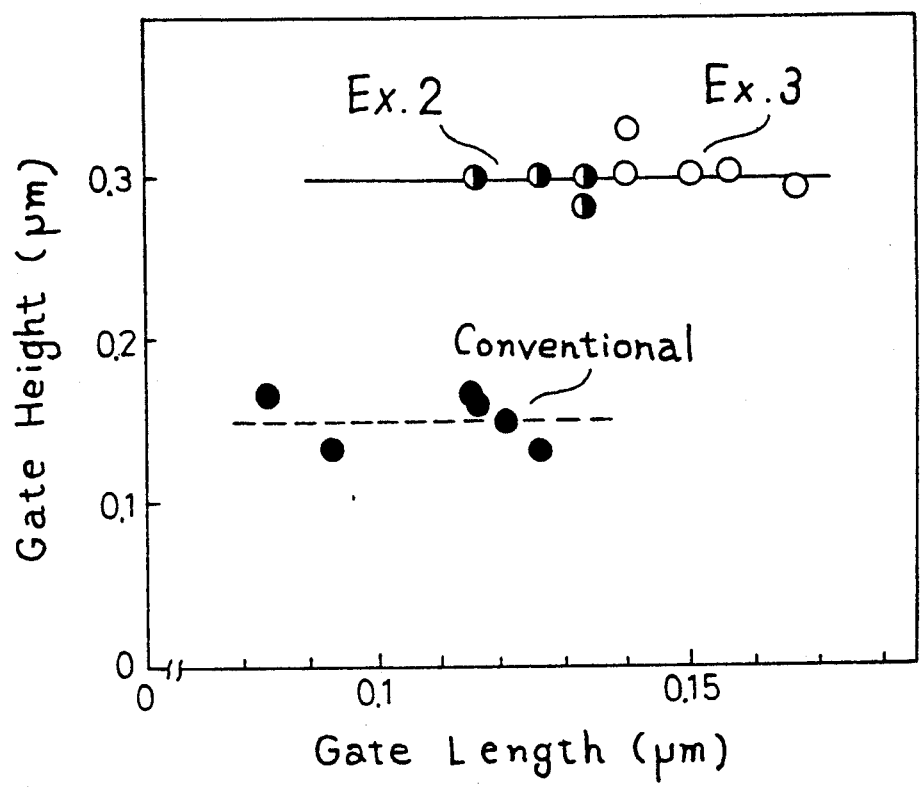
FIG. 3 is a graph showing a relationship between the gate length and height of an electrode prepared in an example of the present invention and of a conventional electrode.
Figure 3:
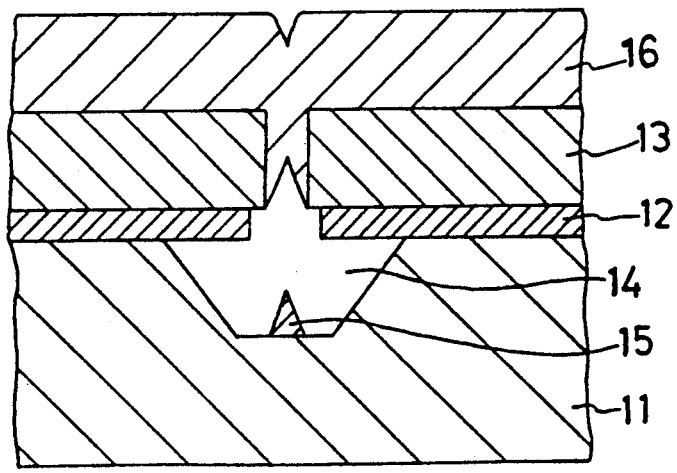

The resultant gate electrode was measured in gate length and height by the use of the scanning electron microscopy. As a result, it was revealed that aluminum member was deposited in almost a desired height in the cavity without depending on the gate length in the range of 0.11 to 0.17 $\mu$m, as shown in FIG. 3, providing the gate electrode of larger height with respect to the gate length. Also, the thickness of the lower resist layer had no relation to the gate length in the range of 0.08 to 0.20 $\mu$m. FIG. 3 also shows the relationship between the gate length and height of the gate electrodes obtained by a conventional method using a single resist layer (0.18 $\mu$m in thickness), one of the lower resist layer used in the Example. Even if the same quantity of aluminum as that of the Example was applied, the conventional method provided a gate electrode at most half in height by the present invention. Specifically, the gate electrode by the conventional method had a higher gate resistance of 600$\Omega$ between gate pads spaced 100 $\mu$m away from each other, whereas the gate electrode by of the present invention had the largely decreased gate resistance of 260$\Omega$.

What is claimed is:

1. A method for preparing an electrode for semiconductor device comprising the steps of:

(a) forming two resist layers sensitive to an electron beam over a silicon nitride film formed on a substrate, said two resist layers being composed of a low sensitive resist layer over the silicon nitride film and a high sensitive resist layer placed over the low sensitive resist layer, (b) irradiating said two resist layers in a predetermined pattern with an electron beam and developing the irradiated resist layers to form a resist pattern having an opening, the opening in the high sensitive resist layer being larger than the opening in the low sensitive resist layer, (c) etching said silicon nitride film through the resist pattern to form in the film an opening corresponding in size to that of the low sensitive resist layer, (d) etching said substrate through the opening in the silicon nitride film to form in the substrate a cavity for the electrode, (e) depositing a metal over said opening in the resist layers to form a metal member having a projected shape on the substrate in said cavity, and (f) removing the resist layers of the resist pattern to lift off the metal layer on the resist layers to leave the metal member having a projected shape as the electrode.

2. The method for preparing an electrode of claim 1 in which the metal member has a width of 0.05 to 0.3 μm and a height of 0.2 to 0.3 μm.

3. The method for preparing an electrode of claim 1 in which the opening size of the low sensitive and the high sensitive resist layers are 0.05 to 0.3 μm and 0.8 to 1.5 μm in diameter, respectively.

4. The method for preparing an electrode of claim 1 in which the low sensitive and the high sensitive resist layers have thickness of 0.05 to 0.20 μm and of 0.2 to 0.4 μm, respectively.

5. The method for preparing an electrode of claim 1 in which the low sensitive and the high sensitive resist layers are each made of a methacrylic acid/phenyl methacrylate copolymer sensitive to the electron beam.

6. The method for preparing an electrode of claim 1 in which the cavity in the substrate has a depth of 0.2 to 0.4 μm.

7. A method for preparing an electrode for semiconductor device, comprising the steps of:

(a) forming three resist layers sensitive to an electron beam over a silicon nitride film formed on a substrate, said three resist layers being composed of a low sensitive resist layer over the silicon nitride film, a high sensitive resist layer over the low sensitive resist layer and a medially sensitive resist layer over the high sensitive resist layer, (b) irradiating said three resist layers in a predetermined pattern with the electron beam and developing the irradiated resist layers to form a resist pattern having an opening through the resist layers, the opening being larger in the high sensitive resist layer than in the low and medially sensitive resist layers and the opening in the medially sensitive resist layer being larger than the opening in the low sensitive resist layer, (c) etching said silicon nitride film through the resist pattern to form in the film an opening corresponding in size to that of the low sensitive resist layer, (d) etching said substrate through the opening in the silicon nitride film to form in the substrate a cavity for preparing electrode, (e) depositing a metal over said opening in the resist layers to form a metal member having a projected shape on the substrate in said cavity, and (f) removing the resist layers of the resist pattern to lift off the metal layer on the resist layers to leave the metal member having a projected shape as the electrode.

8. The method for preparing an electrode of claim 7 in which the metal member has a width of 0.05 to 0.3 μm and a height of 0.2 to 0.3 μm.

9. The method for preparing an electrode of claim 7 in which the opening size of the low sensitive and the high sensitive resist layers are 0.05 to 0.3 μm and 0.8 to 1.5 μm in diameter, respectively.

10. The method for preparing an electrode of claim 7 in which the low sensitive, the medially sensitive and the high sensitive resist layers have thickness of 0.05 to 0.20 μm, of 0.05 to 0.1 μm and of 0.1 to 0.3 μm, respectively.

11. The method for preparing an electrode of claim 7 in which the low sensitive, the medially sensitive and the high sensitive resist layers are each made of a methacrylic acid/phenyl methacrylate copolymer sensitive to the electron beam.

12. The method for preparing an electrode of claim 7 in which the cavity in the substrate has a depth of 0.2 to 0.4 μm.

13. The method for preparing an electrode for semiconductor device of claim 7 in which the low sensitive resist layer, the medially-sensitive resist layer and the high sensitive resist layer are formed from methacrylic acid/phenyl methacrylate copolymers containing 10 to 40 mol %, and 4–8 mol % of methacrylic acid, respectively; and the copolymerization ratios of the low sensitive resist layer, the medially-sensitive resist layer and the high sensitive resist layer are in a descending order as the sensitivity thereof increases.

14. A method for preparing an electrode for semiconductor device, comprising the steps of:

(a) forming three resist layers of varying sensitivity to an electron beam over a silicon nitride film formed on a substrate, the three resist layers comprising a low sensitive resist layer over the silicon nitride film a high sensitive resist layer over the low sensitive resist layer and a medium sensitive resist layer over the high sensitive resist layer, (b) irradiating the three resist layers in a predetermined pattern with the electron beam and developing the irradiated resist layers to form a resist pattern having an opening through the resist layers, the opening being larger in the high sensitive resist layer than in the low and medium sensitive resist layers, and the opening in the medium sensitive resist layer being larger than the opening in the low sensitive resist layer, (c) etching the silicon nitride film through the resist pattern to form an opening in the film corresponding to the opening in the low sensitive resist layer, (d) etching the substrate through the opening in the silicon nitride film to form a cavity in the substrate, (e) depositing metal over the opening of the resist pattern to form a metal electrode having a projected shape in the substrate cavity, and (f) removing the resist layers of the resist pattern and leaving the metal electrode in the substrate cavity.

15. A method for preparing an electrode for semiconductor device comprising the steps of:

(a) forming top and bottom resist layers sensitive to an electron beam over a silicon nitride film formed on a substrate, the bottom resist layer is formed over the silicon nitride film and the top resist layer is formed over the bottom resist layer, the top layer having a higher resist sensitivity to said electron beam than the bottom layer, (b) irradiating the top and bottom resist layers in a predetermined pattern with an electron beam and developing the irradiated resist layers to form a resist pattern having an opening, the opening in the top resist layer being larger than the opening in the bottom resist layer, (c) etching said silicon nitride film through the resist pattern to form an opening in the film, (d) etching said substrate through the opening in the silicon nitride film to form a cavity in the substrate, (e) depositing metal over the opening in the resist layers to form a metal electrode projecting upward from the bottom of the cavity towards the cavity top, and (f) removing the resist layers and any deposited metal on the resist layers.

* * * * *